(12) United States Patent
Wang et al.

(10) Patent No.: US 10,796,905 B2
(45) Date of Patent: Oct. 6, 2020

(54) MANUFACTURE OF GROUP IIIA-NITRIDE LAYERS ON SEMICONDUCTOR ON INSULATOR STRUCTURES

(71) Applicant: GlobalWafers Co., Ltd., Hsinchu (TW)

(72) Inventors: Gang Wang, Grover, MO (US); Michael R. Seacrist, Lake St. Louis, MO (US)

(73) Assignee: GlobalWafers Co., Ltd., Hsinchu (TW)

(*) Notice: Subject to any disclaimer, the term of this patent is extended or adjusted under 35 U.S.C. 154(b) by 0 days.

(21) Appl. No.: 16/292,441

(22) Filed: Mar. 5, 2019

(65) Prior Publication Data

US 2019/0206675 A1   Jul. 4, 2019

Related U.S. Application Data

(62) Division of application No. 15/538,474, filed as application No. PCT/US2015/067139 on Dec. 21, 2015, now Pat. No. 10,262,855.

(60) Provisional application No. 62/095,282, filed on Dec. 22, 2014.

(51) Int. Cl.
| | | |
|---|---|---|
| H01L 29/20 | (2006.01) |
| H01L 21/3205 | (2006.01) |
| H01L 21/02 | (2006.01) |
| H01L 33/00 | (2010.01) |
| H01L 21/762 | (2006.01) |
| H01L 29/778 | (2006.01) |

(52) U.S. Cl.
CPC ...... H01L 21/0243 (2013.01); H01L 21/7624 (2013.01); H01L 33/0075 (2013.01); *H01L 21/76254* (2013.01); *H01L 29/7786* (2013.01)

(58) Field of Classification Search
CPC .................................................. H01L 33/0075
USPC ........................ 438/597–606; 257/613, 615
See application file for complete search history.

(56) References Cited

U.S. PATENT DOCUMENTS

| | | | |
|---|---|---|---|
| 7,101,762 B2 | 9/2006 | Cohen et al. | |
| 8,236,638 B2 | 8/2012 | Loiko et al. | |
| 8,507,357 B2 | 8/2013 | Lin et al. | |
| 8,723,185 B2 | 5/2014 | Chen et al. | |
| 8,786,053 B2 * | 7/2014 | D'Evelyn | ............... H01L 29/02 257/617 |
| 8,846,505 B2 | 9/2014 | Einav | |

(Continued)

FOREIGN PATENT DOCUMENTS

| | | |
|---|---|---|
| EP | 2426701 A1 | 3/2012 |
| JP | 2012-253364 A | 12/2012 |

OTHER PUBLICATIONS

Morkoc, H. Editor, "Chapter 3.5.5.3, Nanoheteroepitaxy and Nano-ELO" in Handbook of Nitride Semiconductors and Devices: Materials Properties, Physics and Growth, vol. 1, pp. 564-569 (2009).

(Continued)

*Primary Examiner* — Calvin Lee
(74) *Attorney, Agent, or Firm* — Armstrong Teasdale LLP

(57) ABSTRACT

A method is provided for forming Group IIIA-nitride layers, such as GaN, on substrates. The Group IIIA-nitride layers may be deposited on mesa-patterned semiconductor-on-insulator (SOI, e.g., silicon-on-insulator) substrates. The Group IIIA-nitride layers may be deposited by heteroepitaxial deposition on mesa-patterned semiconductor-on-insulator (SOI, e.g., silicon-on-insulator) substrates.

14 Claims, 8 Drawing Sheets

(56) References Cited

U.S. PATENT DOCUMENTS

| | | | |
|---|---|---|---|
| 9,650,723 B1* | 5/2017 | D'Evelyn | C30B 7/105 |
| 9,653,286 B2 | 5/2017 | Ohlsson et al. | |
| 9,882,353 B2* | 1/2018 | Hsu | H01S 5/0215 |
| 9,905,550 B2* | 2/2018 | Han | H01L 21/561 |
| 10,262,855 B2* | 4/2019 | Wang | H01L 21/02381 |
| | | | 438/606 |
| 10,483,379 B2* | 11/2019 | Liu | H01L 29/518 |
| 2009/0072272 A1* | 3/2009 | Suh | H01L 29/1066 |
| | | | 257/194 |
| 2011/0045658 A1 | 2/2011 | Liu et al. | |

OTHER PUBLICATIONS

Zimir, S et al., "Reduction of Cracks in GaN Films Grown on Si-on-Insulator by Lateral Confined Epitaxy," Journal of Crystal Growth, 243(3-4): 375-380 (2002).
International Search Report and Written Opinion from PCT/US2015/067139 dated May 25, 2016 (16 pages).

* cited by examiner

MANUFACTURE OF GROUP IIIA-NITRIDE LAYERS ON SEMICONDUCTOR ON INSULATOR STRUCTURES

CROSS-REFERENCE TO RELATED APPLICATION

This application is a divisional application of U.S. application Ser. No. 15/538,474, which was filed Jun. 21, 2017, which granted on Apr. 16, 2019 as U.S. Pat. No. 10,262,855, the entire disclosure of which is hereby incorporated by reference in its entirety. U.S. application Ser. No. 15/538,474 is a 35 U.S.C. § 371 National Stage Application of International Application No. PCT/US2015/067139, which was filed Dec. 21, 2015, the entire disclosure of which is hereby incorporated by reference in its entirety. International Application No. PCT/US2015/067139 claims priority to U.S. Provisional Patent Application No. 62/095,282 filed on 22 Dec. 2014, the entire disclosure of which is hereby incorporated by reference in its entirety.

THE FIELD OF THE INVENTION

The present invention generally relates to the field of semiconductor wafer manufacture. More specifically, the present invention relates to a method for forming a Group IIIA-nitride layer on the device layer of a semiconductor-on-insulator (e.g., silicon-on-insulator) structure.

BACKGROUND OF THE INVENTION

Semiconductor wafers are generally prepared from a single crystal ingot (e.g., a silicon ingot) which is trimmed and ground to have one or more flats or notches for proper orientation of the wafer in subsequent procedures. The ingot is then sliced into individual wafers. While reference will be made herein to semiconductor wafers constructed from silicon, other materials may be used to prepare semiconductor wafers, such as silicon carbide, sapphire, and aluminum nitride.

Semiconductor wafers (e.g., silicon wafers) may be utilized in the preparation of composite layer structures. A composite layer structure (e.g., a semiconductor-on-insulator, and more specifically, a silicon-on-insulator (SOI) structure) generally comprises a handle wafer or layer, a device layer, and an insulating (i.e., dielectric) film (typically an oxide layer) between the handle layer and the device layer. Generally, the device layer is between 0.01 and 20 micrometers thick, such as between 0.05 and 20 micrometers thick. In general, composite layer structures, such as silicon-on-insulator (SOI), silicon-on-sapphire (SOS), and silicon-on-quartz, are produced by placing two wafers in intimate contact, followed by a thermal treatment to strengthen the bond.

After thermal anneal, the bonded structure undergoes further processing to remove a substantial portion of the donor wafer to achieve layer transfer. For example, wafer thinning techniques, e.g., etching or grinding, may be used, often referred to as back etch SOI (i.e., BESOI), wherein a silicon wafer is bound to the handle wafer and then slowly etched away until only a thin layer of silicon on the handle wafer remains. See, e.g., U.S. Pat. No. 5,189,500, the disclosure of which is incorporated herein by reference as if set forth in its entirety. This method is time-consuming and costly, wastes one of the substrates and generally does not have suitable thickness uniformity for layers thinner than a few microns.

Another common method of achieving layer transfer utilizes a hydrogen implant followed by thermally induced layer splitting. Particles (e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds deposited on the wafer during the implantation process.

The front surface of the donor wafer is then bonded to a handle wafer to form a bonded wafer through a hydrophilic bonding process. Prior to bonding, the donor wafer and/or handle wafer are activated by exposing the surfaces of the wafers to plasma containing, for example, oxygen or nitrogen. Exposure to the plasma modifies the structure of the surfaces in a process often referred to as surface activation, which activation process renders the surfaces of one or both of the donor water and handle wafer hydrophilic. The wafers are then pressed together, and a bond is formed there between. This bond is relatively weak, and must be strengthened before further processing can occur.

In some processes, the hydrophilic bond between the donor wafer and handle wafer (i.e., a bonded wafer) is strengthened by heating or annealing the bonded wafer pair. In some processes, wafer bonding may occur at low temperatures, such as between approximately 300° C. and 500° C. In some processes, wafer bonding may occur at high temperatures, such as between approximately 800° C. and 1100° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane.

A portion of the donor wafer is then separated (i.e., cleaved) along the cleave plane from the bonded wafer to form the SOI wafer. Cleaving may be carried out by placing the bonded wafer in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge at the edge of the bonded wafer at the cleave plane in order to initiate propagation of a crack along the cleave plane. The mechanical force applied by the suction cups then pulls the portion of the donor wafer from the bonded wafer, thus forming an SOI wafer.

According to other methods, the bonded pair may instead be subjected to an elevated temperature over a period of time to separate the portion of the donor wafer from the bonded wafer. Exposure to the elevated temperature causes initiation and propagation of a crack along the cleave plane, thus separating a portion of the donor wafer. This method allows for better uniformity of the transferred layer and allows recycle of the donor wafer, but typically requires heating the implanted and bonded pair to temperatures approaching 500° C.

Crystal growth of bulk Group IIIA-nitrides, particularly GaN, is challenging and has not been successful in volume production. Conventionally, Group IIIA-nitrides, such as GaN, are produced by heteroepitaxial deposition on wafer substrates made of sapphire, silicon carbide, and silicon. Deposition of Group IIIA-nitrides on semiconductor wafers is challenging due to mismatch of the coefficient of thermal expansion (CTE) between GaN and the substrate, which leads to large bow of the wafer substrate and cracks in the deposited Group IIIA-nitride layer.

Conventionally, there have been several engineering approaches to address the residual stress in heteroepitaxially deposited Group IIIA-nitride, e.g., GaN, layers on semiconductor substrates. In one solution, Group IIIA-nitride layers are deposited on thick semiconductor substrates. For example, silicon substrates have been used having a thickness of at least about 1.0 millimeter, such as 1.5 millimeters have been used to reduce the wafer bow caused by the heteroepitaxially deposited GaN layer. This approach does not change the stress, but does mitigate stress induced substrate deformation by increasing the stiffness of the substrate. Although the wafer bow is reduced, the residual stress does not change and cracks in the GaN layer may still be present. Cracks are a killer defect for the growth of thick GaN layers (>5 um) as used in high-voltage power devices (>800V). Layer cracking and wafer bow become more severe when scaling the substrate diameter up to 200 mm or beyond.

In another technique for reducing defectivity in the deposited Group IIIA-nitride layer (e.g., GaN), a buffer layer having a thickness between about 2 micrometers and about 5 micrometers may be deposited on the wafer substrate prior to formation of the Group IIIA-nitride layer (e.g., GaN). The buffer layer may comprise aluminum nitride, aluminum gallium nitride, or a multilayer comprising aluminum nitride and aluminum gallium nitride. The residual stress in the AlN/AlGaN buffers tends to deform the substrate and thus creates temperature non-uniformity across the substrate, which results in non-uniformity in either layer thickness or composition. See Dadgar, Journal of Crystal Growth, 272 (2004) 72-75. Additionally, stress in the GaN layer raises a concern in terms of device performance. See Zhang, J. Appl. Phys., 108, 073522 (2010).

In another approach, the buffer structure is optimized to induce compressive stress in the Group IIIA-nitride layer (e.g., GaN) so that the CTE mismatch induced tensile stress can be partially compensated. An example of this technique is the use of a thin low-temperature AlN interlayer during GaN epitaxial growth. GaN grown on strain relaxed AlN or AlGaN layer is compressively stressed. As the dislocation in GaN has low mobility, the strain relaxation in GaN layer is not complete. At the end of epitaxy, a compressive stress is left in the GaN layer to compensate the tensile stress induced by CTE mismatch. See, e.g., Amano, J. Appl. Phys. 37, L1540 (1998), and Krost & Dadgar, Phys. Stat. Sol. (a) 200, No. 1, 26-35 (2003). As the AlN interlayer and the AlGaN buffer layer only partially compensate the tensile stress in GaN, the crack-free GaN thickness is still limited to a few micrometers.

In yet another approach, Group IIIA-nitrides, such as GaN, are grown on patterned substrates. See, e.g., U.S. Pat. No. 8,507,737, which discloses GaN growth on patterned sapphire substrates. See also U.S. Pub. No. 2011/004568, which discloses grooved substrates. It has also been reported that GaN may grow on patterned Si (111) substrates. See Kawaguch, phys. stat. sol. (a) 176, 553 and Sawaki, Journal of Crystal Growth 311 (2009) 2867-2874. The aim of this method is to relieve the stress at the edge of the GaN islands. However, the stress relief is only effective in GaN layers with lateral dimension of a few hundred micrometers.

Still further, GaN has been grown on compliant substrates. GaN growth on SOI substrates shows improved crystalline quality as discussed by Cao, J. Appl. Phys., 83, 3829, 1998. However, there is no detailed study on the advantage of using blanket SOI substrates in terms of crack and stress relaxation. This approach may reduce GaN defectivity but not necessarily increase the thickness of crack-free GaN.

Finally, the use of a backside CTE layer to balance wafer bow has been disclosed in U.S. Pub. No. 2012/0132921. U.S. Pub. No. 2012/0132921 discloses a method to balance the tensile stress in GaN using a CTE layer on the backside of the substrate. The challenge of this method is that the response of the CTE film to temperature change must follow that of GaN.

SUMMARY OF THE INVENTION

A method is provided for depositing Group IIIA-nitride layers on semiconductor-on-insulator (SOI) substrates. In some embodiments, Group IIIA-nitride layers (e.g., gallium nitride (GaN) layers) are formed by heteroepitaxial deposition on semiconductor-on-insulator substrates. Prior to deposition of the Group IIIA-nitride layers, the semiconductor-on-insulator substrates are subjected to a process that yields a pattern of mesa islands in the device layer of the SOI substrate. In some embodiments, the pattern of mesa islands comprises semi-floating, floating, or combinations of both floating and semi-floating mesa islands supported by supporting columns formed in the dielectric layer of the SOI substrates. The Group IIIA-nitride layers may be formed on the mesa islands formed in the device layers. This method is designed to address the mismatch of coefficients of thermal expansion (CTE) between a Group IIIA-nitride, e.g., GaN, and the substrate as well as to provide Group IIIA-nitride epitaxial templates that are ready to be transferred to a dissimilar carrier substrate at low cost.

Briefly, the present invention is directed to a method of forming a multilayer structure. The method comprises: forming a pattern comprising a plurality of mesa islands on a semiconductor-on-insulator structure, wherein the semiconductor-on-insulator structure comprises a single crystal semiconductor handle wafer, a dielectric layer in interfacial contact with the single crystal semiconductor handle wafer, and a single crystal semiconductor device layer in interfacial contact with the dielectric layer, and further wherein the pattern comprising the plurality of mesa islands is formed in the single crystal semiconductor device layer; and forming a Group IIIA-nitride layer on the plurality of mesa islands.

The present invention is further directed to a multilayer structure comprising: a single crystal semiconductor handle wafer comprising two major, generally parallel surfaces, one of which is a front surface of the single crystal semiconductor handle wafer and the other of which is a back surface of the single crystal semiconductor handle wafer, a circumferential edge joining the front and back surfaces of the single crystal semiconductor handle wafer, a bulk region between the front and back surfaces, and a central plane of the single crystal semiconductor handle wafer between the front and back surfaces of the single crystal semiconductor handle wafer; a dielectric layer in interfacial contact with a major surface of the single crystal semiconductor handle wafer; a single crystal semiconductor device layer in interfacial contact with the dielectric layer, the single crystal semiconductor device layer comprising a pattern comprising a plurality of mesa islands; and a Group IIIA-nitride layer on the mesa islands.

The present invention is still further directed to a multilayer structure comprising: a carrier substrate; an interfacial bonding layer; and a Group IIIA-nitride layer, the Group IIIA-nitride layer having a thickness between about 500 nanometers and about 1000 micrometers.

Other objects and features of this invention will be in part apparent and in part pointed out hereinafter.

DETAILED DESCRIPTION OF THE EMBODIMENT(S) OF THE INVENTION

Figure 1A:
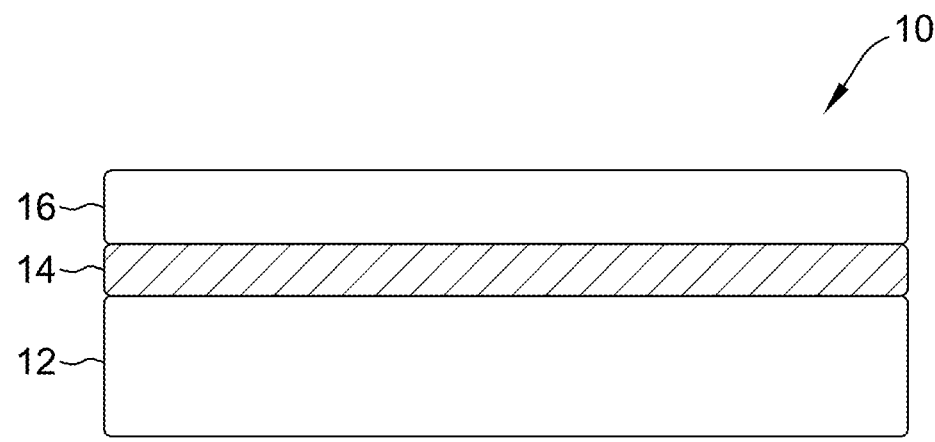
FIGS. 1A through 1D depict an embodiment of the process of the present invention.

According to the present invention, a method is provided for forming a Group IIIA-nitride layer, such as a layer comprising GaN, on a substrate. In some embodiments, the Group IIIA-nitride layer (e.g., a GaN layer) is deposited on a mesa-patterned semiconductor-on-insulator (SOI, e.g., silicon-on-insulator) substrate. In some embodiments, the Group IIIA-nitride layer may be deposited by heteroepitaxial deposition on mesa-patterned semiconductor-on-insulator (SOI, e.g., silicon-on-insulator) substrates. More particularly, a semiconductor-on-insulator structure is prepared to comprise a pattern comprising a plurality of mesa islands. The pattern comprising the plurality of mesa islands is formed in the single crystal semiconductor device layer (e.g., a single crystal silicon device layer) of the SOI substrate. In the context of the present disclosure, reference to "device layer" is to the layer of semiconductor material (typically single crystal silicon) on an SOI substrate that results from a conventional layer transfer process used to form a SOI structure. Stated another way, an SOI structure comprises a handle wafer, a dielectric layer (typically a buried oxide layer, or BOX), and a device layer, and it is formed by conventional layer transfer using a handle wafer and a donor wafer. The device layer is derived from a single crystal semiconductor donor wafer. A "device layer" in the context of this disclosure does not necessarily refer to the semiconductor material in which a device may be formed. Rather, in the context of this disclosure, devices are generally formed in the Group IIIA-nitride layers formed by the method of the present invention. The Group IIIA-nitride layer may be formed on the mesa islands formed in the single crystal semiconductor device layer of an SOI substrate.

In some embodiments, a buffer layer may be formed on the plurality of mesa islands formed in the single crystal semiconductor device layer. The Group IIIA-nitride layer may be formed on the buffer layer formed on the mesa islands. In the context of the present invention, a mesa island formed in the single crystal semiconductor device layer (e.g., a single crystal silicon device layer) comprises a flat surface for deposition of a Group IIIA-nitride. Essentially perpendicular to the deposition surface are sidewalls that define the contours of the mesa islands. The mesa islands are supported by the dielectric layer of the semiconductor-on-insulator structure.

In some embodiments, the dielectric layer is modified by removing a portion thereof, leaving support columns underneath the mesa islands. In some embodiments, therefore, the pattern of semi-floating, floating, or combinations of floating and semi-floating single crystal semiconductor mesa islands is supported by the supporting columns derived from the dielectric layer. In the context of the present invention, a pattern of semi-floating islands comprises interconnection or bridging between islands. See, e.g., FIG. 2A. Interconnecting the islands with semiconductor material derived from the device layer helps overcome gravity induced layer collapse. In some embodiments, e.g., FIG. 2B, the mesa islands are floating in that the islands lack an interconnecting bridge between islands. In still further embodiments, the pattern of mesa islands may comprise both floating and semi-floating islands, i.e., in some segments of the wafer, the mesa islands may be connected by semiconductor material, while in other segments of the wafer, the mesa islands are not connected. The method of the present invention is intended to address the mismatch of coefficients of thermal expansion (CTE) between GaN and the SOI substrate.

In some embodiments, devices may be manufactured directly in the Group IIIA-nitride layer formed on the pattern of mesa islands. In some embodiments, the Group IIIA-nitride layer grown on the pattern comprising a plurality of mesa islands may be transferred to a dissimilar carrier substrate, and the Group IIIA-nitride layer may undergo further growth prior to manufacture of devices in the Group IIIA-nitride layer. In some embodiments, GaN templates grown on the SOI structure are ready to be transferred to a dissimilar carrier substrate. The method enables the transfer of a Group IIIA-nitride layer to a dissimilar carrier substrate at low cost. In some embodiments, after the Group IIIA-nitride layer is transferred to the dissimilar carrier substrate, it may be thickened. In some embodiments, the thickening technique comprises epitaxial deposition. Devices may be fabricated in the thickened Group IIIA-nitride layer. In some embodiments, the method of the present invention enables manufacture of devices that can currently be made only on bulk GaN such as vertical GaN on GaN high voltage power device, GaN on GaN LEDs, and laser diodes.

1. Semiconductor-On-Insulator Substrate

The substrates for use in the present invention are semiconductor-on-insulator structures, e.g., a silicon-on-insulator structure. See FIG. 1A. A semiconductor-on-insulator structure 10 is formed by bonding a semiconductor handle wafer 12 and a semiconductor donor wafer. A dielectric layer 14 is located between the semiconductor handle wafer 12 and the semiconductor device layer 16. During SOI manufacture, the intervening dielectric layer 14 may be formed on the front surface of the semiconductor handle wafer 12, or it may be formed on the semiconductor donor wafer. In some SOI manufacture processes, dielectric layers may be formed on both wafers. The semiconductor device layer 16 in a semiconductor-on-insulator composite structure 10 is derived from a semiconductor donor wafer. The semiconductor device layer 16 may be transferred onto the semiconductor handle wafer 12 by wafer thinning techniques such as etching a semiconductor donor substrate or by cleaving a semiconductor donor substrate comprising a damage plane.

In general, the single crystal semiconductor handle wafer 12 and single crystal semiconductor donor wafer (the device layer 16 is derived from the donor wafer in SOI manufacture) comprise two major, generally parallel surfaces. One of the parallel surfaces is a front surface of the wafer, and the other parallel surface is a back surface of the wafer. Wafers comprise a circumferential edge joining the front and back surfaces, and a central plane between the front and back surfaces. Wafers additionally comprise an imaginary central axis perpendicular to the central plane and a radial length that extends from the central axis to the circumferential edge. In addition, because wafers, e.g., silicon wafers, typically have some total thickness variation (TTV), warp, and bow, the midpoint between every point on the front surface and every point on the back surface may not precisely fall within a plane. As a practical matter, however, the TTV, warp, and bow are typically so slight that to a close approximation the midpoints can be said to fall within an imaginary central plane which is approximately equidistant between the front and back surfaces.

Figure 1B:
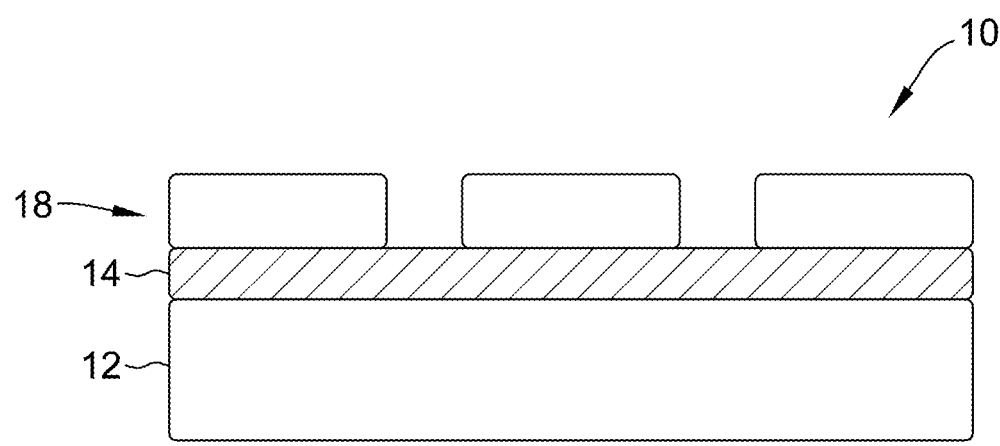
Figure 1C:
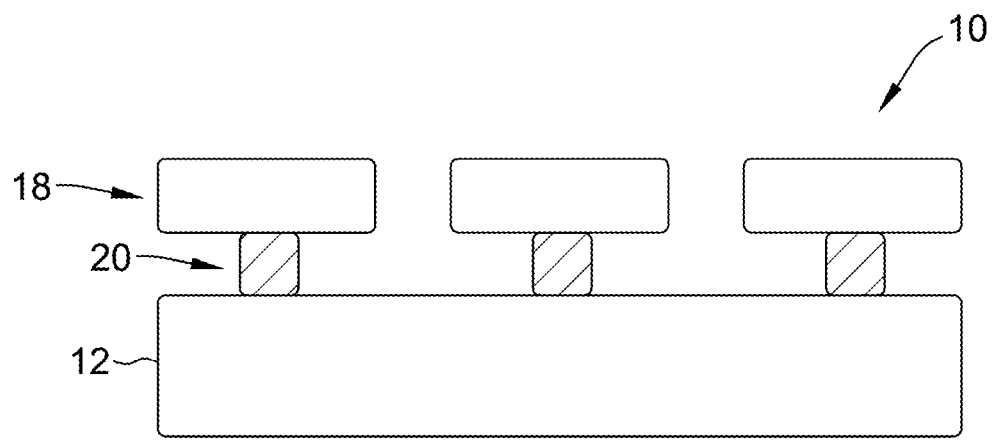
Figure 2A:
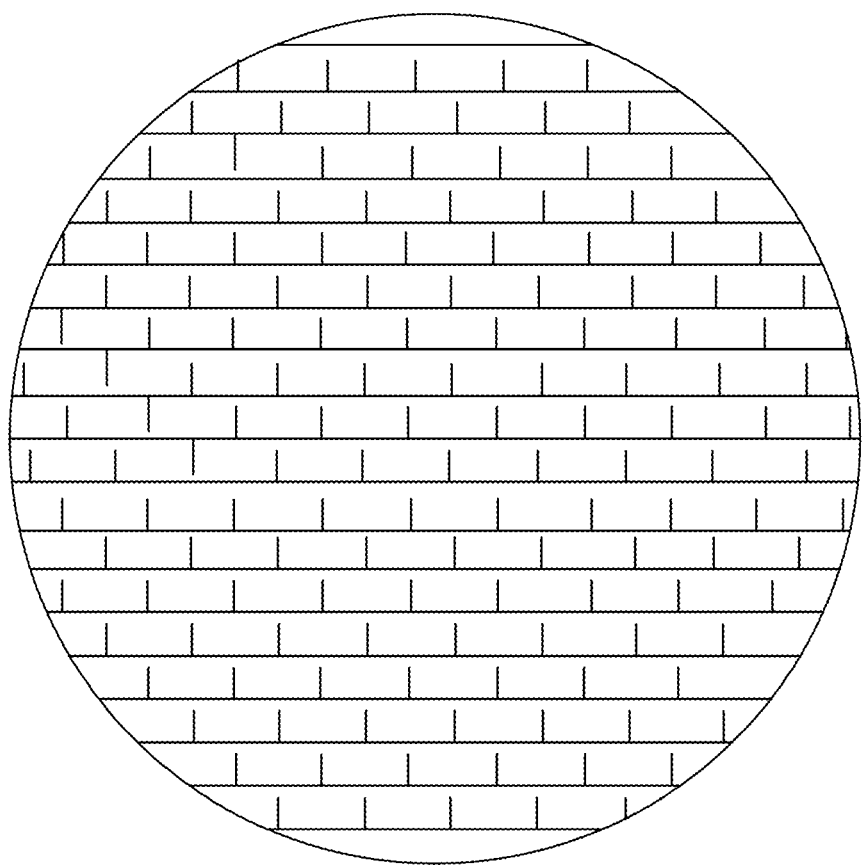
FIG. 2A depicts a pattern of semi-floating mesa islands on an SOI substrate according to an embodiment of the present invention.
Figure 2B:
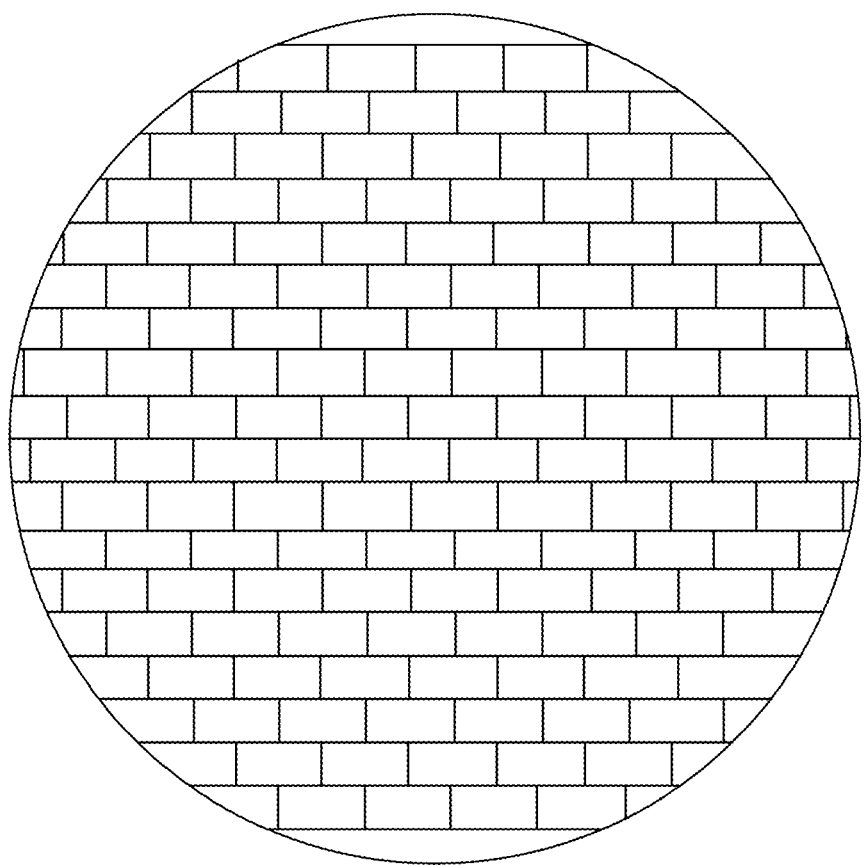
FIG. 2B depicts a pattern of floating mesa islands on an SOI substrate according to an embodiment of the present invention.

With reference still to FIG. 1A, the semiconductor device layer 16 in a semiconductor-on-insulator composite structure 10 is derived from a single crystal semiconductor donor wafer. The semiconductor device layer 16 may be transferred onto the semiconductor handle wafer 12 by wafer thinning techniques such as etching a semiconductor donor substrate or by cleaving a semiconductor donor substrate comprising a damage plane. Upon completion of conventional bonding and wafer thinning steps, the semiconductor-on-insulator (e.g., silicon-on-insulator) composite structure 10 comprises the single crystal semiconductor handle wafer 12, a dielectric layer 14 such as a buried oxide layer, and the single crystal semiconductor device layer 16. A finished SOI substrate is subjected to mesa patterning according to the method of the present invention, prior to deposition of the Group IIIA-nitride layer. More specifically, the device layer 16 is subjected to a series of steps to thereby form a pattern of mesa islands in the semiconductor device layer. See FIG. 1B, in which a semiconductor-on-insulator (e.g., silicon-on-insulator) composite structure 10 comprising a single crystal semiconductor handle wafer 12, a dielectric layer 14 such as a buried oxide layer, and a pattern of mesa islands 18, which are derived from the semiconductor device layer 16 of FIG. 1A. It is upon this pattern of mesa islands 18 (FIGS. 1B and 1C) formed from the device layer 16 (FIG. 1A) that the Group IIIA-nitride layers are formed. In some embodiments, the pattern of mesa islands 18 may comprise semi-floating islands. See FIG. 2A, which is top view exemplary depiction of semi-floating mesa islands. In the context of the present invention, a pattern of semi-floating islands comprises interconnection or bridging between islands. This is represented by the semiconductor material linking islands in FIG. 2A, which is a top view of a pattern of interconnected mesa islands. The bridging semiconductor material, which is derived from the device layer 16 of FIG. 1A may be substantially located as depicted in FIG. 2A, but other linking configurations are possible, such as substantially connecting at or near the middle of the islands, and further one island may be linked with one adjacent island, two adjacent islands, three adjacent islands, four adjacent islands, or even more depending up on the shape of the islands. In some embodiments, the pattern of mesa islands 18 may comprise floating islands. See FIG. 2B, which is top view depiction of floating mesa islands. As depicted in FIG. 2B, the mesa islands are floating in that the islands lack an interconnecting bridge between islands. In yet other embodiments, the pattern of mesa islands may comprise both floating and semi-floating islands, i.e., in some segments of the wafer, the mesa islands may be connected by semiconductor material, while in other segments of the wafer, the mesa islands are not connected. Still further, the dielectric layer may also be etched to reveal supporting columns that support the mesa islands. See FIG. 1C, which depicts the semiconductor-on-insulator (e.g., silicon-on-insulator) composite structure 10 comprising the single crystal semiconductor handle wafer 12 and the pattern of mesa islands 18. The SOI structure 10 of FIG. 1C comprises support structures 20 underneath each mesa island. The support structures 20 comprise a dielectric material (e.g., silicon dioxide) since they are derived from the dielectric layer 14 as depicted in FIGS. 1A and 1B.

The semiconductor handle wafer 12 and the device layer 16 may comprise single crystal semiconductor material. In some embodiments, the semiconductor material may be selected from the group consisting of silicon, silicon carbide, sapphire, and aluminum nitride. In some embodiments, the semiconductor may comprise silicon or sapphire. The handle wafer 12 and the device layer 14 may comprise the same semiconductor material, or they may be different. In view thereof, SOI structures 16 may comprise, e.g., silicon-on-insulator, sapphire-on-insulator, aluminum nitride-on-insulator, and other combinations. The semiconductor-on-insulator structures 16 typically have a nominal diameter of at least about 150 mm, at least about 200 mm, at least about 300 mm, or at least about 450 mm. Thicknesses may vary from about 250 micrometers to about 1500 micrometers, such as between about 300 micrometers and about 1000 micrometers, suitably within the range of about 500 micrometers to about 1000 micrometers.

In particularly preferred embodiments, the semiconductor on insulator structures 10 are prepared from handle wafers and donor wafers that are single crystal silicon wafers which have been sliced from a single crystal ingot grown in accordance with conventional Czochralski crystal growing methods or float zone growing methods. Such methods, as well as standard silicon slicing, lapping, etching, and polishing techniques are disclosed, for example, in F. Shimura, Semiconductor Silicon Crystal Technology, Academic Press, 1989, and Silicon Chemical Etching, (J. Grabmaier ed.) Springer-Verlag, N.Y., 1982 (incorporated herein by reference). Preferably, the wafers are polished and cleaned by standard methods known to those skilled in the art. See, for example, W. C. O'Mara et al., *Handbook of Semiconductor Silicon Technology*, Noyes Publications. If desired, the wafers can be cleaned, for example, in a standard SC1/SC2 solution. In some embodiments, the single crystal silicon wafers of the present invention are single crystal silicon wafers which have been sliced from a single crystal ingot grown in accordance with conventional Czochralski ("Cz") crystal growing methods, typically having a nominal diameter of at least about 150 mm, at least about 200 mm, at least about 300 mm, or at least about 450 mm. Preferably, both the single crystal silicon handle wafer and the single crystal silicon donor wafer have mirror-polished front surface finishes that are free from surface defects, such as scratches, large particles, etc. Wafer thickness may vary from about 250 micrometers to about 1500 micrometers, such as between about 300 micrometers and about 1000 micrometers, suitably within the range of about 500 micrometers to about 1000 micrometers. In some specific embodiments, the wafer thickness may be about 725 micrometers.

In some embodiments, the single crystal semiconductor wafers, i.e., handle wafer and donor wafer, comprise interstitial oxygen in concentrations that are generally achieved by the Czochralski-growth method. In some embodiments, the semiconductor wafers comprise oxygen in a concentration between about 4 PPMA and about 18 PPMA. In some embodiments, the semiconductor wafers comprise oxygen in a concentration between about 10 PPMA and about 35 PPMA. In some embodiments, the single crystal silicon handle wafer comprises oxygen in a concentration of no greater than about 10 PPMA. Interstitial oxygen may be measured according to SEMI MF 1188-1105.

The single crystal silicon handle wafer 12 may have any of (100), (110), or (111) crystal orientation. The crystal orientation of the handle wafer 12 is often not critical since the handle wafer 12 is often not a part of the finished device. In some embodiments, the single crystal silicon donor wafer has a (111) crystal orientation. Accordingly and again with reference to FIG. 1A, the semiconductor-on-insulator structure 10 comprises a single crystal device layer 14 having a (111) crystal orientation. The (111) silicon crystal orientation is preferred in order to obtain high quality epitaxial growth of Group IIIA-nitride materials. Other crystal orientations, such as (100) and (110), are not as successful for epitaxial deposition of Group IIIA-nitrides. For example, the (111) silicon crystal orientation is preferred since it is consistent with the hexagonal growth habit of GaN.

In some embodiments, the single crystal semiconductor handle wafer 12, such as a single crystal silicon handle wafer, and/or the semiconductor device layer 16, e.g., a single crystal silicon device layer, has a relatively high minimum bulk resistivity. High resistivity wafers are generally sliced from single crystal ingots grown by the Czochralski method or float zone method. Cz-grown silicon wafers may be subjected to a thermal anneal at a temperature ranging from about 600° C. to about 1000° C. in order to annihilate thermal donors caused by oxygen that are incorporated during crystal growth. In some embodiments, the single crystal semiconductor handle wafer has a minimum bulk resistivity of at least 10 Ohm-cm, at least 100 Ohm-cm, at least about 500 Ohm-cm, at least about 1000 Ohm-cm, or even at least about 3000 Ohm-cm, such as between about 100 Ohm-cm and about 100,000 Ohm-cm, or between about 500 Ohm-cm and about 100,000 Ohm-cm, or between about 1000 Ohm-cm and about 100,000 Ohm-cm, or between about 500 Ohm-cm and about 10,000 Ohm-cm, or between about 750 Ohm-cm and about 10,000 Ohm-cm, between about 1000 Ohm-cm and about 10,000 Ohm-cm, between about 2000 Ohm-cm and about 10,000 Ohm-cm, between about 3000 Ohm-cm and about 10,000 Ohm-cm, or between about 3000 Ohm cm and about 5,000 Ohm-cm. Methods for preparing high resistivity wafers are known in the art, and such high resistivity wafers may be obtained from commercial suppliers, such as SunEdison Semiconductor Ltd. (St. Peters, Mo.; formerly MEMC Electronic Materials, Inc.).

To form the semiconductor-on-insulator structure 10, the single crystal semiconductor handle wafer 12 is bonded to a single crystal semiconductor donor wafer, e.g., a single crystal semiconductor donor wafer, which is prepared according to conventional layer transfer methods. That is, the single crystal semiconductor donor wafer may be subjected to standard process steps including oxidation, implant, and post implant cleaning. Accordingly, a single crystal semiconductor donor wafer of a material that is conventionally used in preparation of multilayer semiconductor structures, e.g., a single crystal silicon donor wafer, that has been etched and polished and oxidized, is subjected to ion implantation to form a damage layer in the donor substrate.

The handle wafer and donor wafer are brought into intimate contact to thereby form a bonded structure. Since the mechanical bond is relatively weak, the bonded structure is further annealed by conventional methods to solidify the bond between the donor wafer and the handle wafer. After the thermal anneal, the bond between the wafers is strong enough to initiate layer transfer via cleaving the bonded structure at the cleave plane. Cleaving may occur according to techniques known in the art. With reference to FIG. 1A, cleaving removes a portion of the semiconductor donor wafer, thereby leaving a semiconductor device layer 16, preferably a silicon device layer, in interfacial contact with a dielectric layer 14 (i.e., a buried oxide layer or BOX), which is in contact with a single crystal semiconductor (e.g., silicon) handle wafer 12. The entire structure comprises the semiconductor-on-insulator composite structure 10, which is the substrate for the process of the present invention.

With reference again to FIG. 1A, between the handle substrate 12 and the device layer 16 is a dielectric layer 14. Suitable dielectric layer 14 materials include silicon dioxide, silicon nitride, silicon oxynitride, hafnium oxide, titanium oxide, zirconium oxide, lanthanum oxide, barium oxide, and a combination thereof. In some preferred embodiments, the dielectric layer 14 comprises a buried oxide layer, i.e., a BOX. The dielectric layer thickness may be between about 10 nanometers and about 5000 nanometers, such as between about 10 nanometers and about 1000 nanometers, such as between about 50 nanometers and about 500 nanometers.

The single crystal semiconductor device layer 16, e.g., a single crystal silicon device layer, may have a thickness between about 1 nanometer and about 500 nanometers, such as between about 5 nanometers and about 100 nanometers. Again, the SOI structure 10 preferably comprises a device layer 16 having Si (111) crystal orientation in order to obtain high quality epitaxial growth of Group IIIA-nitride materials.

2. Forming Mesa Islands in the Device Layer of a Semiconductor-On-Insulator Substrate According to the method of the present invention, and with reference to FIG. 1B, a pattern comprising a plurality of mesa islands 18 is formed on a semiconductor-on-insulator structure 10. More specifically, the pattern comprising the plurality of mesa islands 18 is formed in the single crystal semiconductor device layer 16. Compare FIG. 1A and FIG. 1B, which are illustrations depicting the starting SOI substrate (FIG. 1A) and an SOI substrate comprising a pattern of mesa islands 18 (FIG. 1B), in which the mesa islands are prepared in the original semiconductor device layer 16. The pattern comprising the plurality of mesa islands 18 preferably comprises shapes formed into the semiconductor device layer 16 that are useful in the final structure which incorporates the Group IIIA-nitride layer. In some embodiments, the mesa islands 18 are formed by removing a portion of the single crystal semiconductor device layer 16. In some embodiments, the mesa islands 18 are formed using lithography. Lithography defines the patterns by photoresist. The removal of the semiconductor material in the device layer 16, e.g., silicon between islands, is realized by selective etch of semiconductor material, e.g., silicon using reactive ion etch (RIE) or wet etch. In RIE, $Cl_2$ gas selectively etches semiconductor, e.g., silicon. In wet etch, an aqueous KOH solution or an aqueous TMAH solution can be used. Once the device layer 16 is opened, the photoresist is stripped and the wafer is subject to HF solution to under etch the BOX so that floating and semi-floating mesa islands 18 (FIG. 1C) are obtained. The shape of the islands is not critical, but rectangular or square shapes are preferred for device fabrication on the GaN layers. See FIG. 2A depicting a pattern of semi-floating mesa islands on an SOI substrate according to an embodiment of the present invention, and FIG. 2B depicting a pattern of floating mesa islands on an SOI substrate according to an embodiment of the present invention.

In some embodiments of the mesa patterning, floating mesa islands, i.e., mesa islands with no interconnecting bridges of semiconductor material, are not preferred because it is preferable to maximize the lateral dimension of the islands. Moreover, interconnection or bridging between islands helps overcome gravity induced layer collapse. In some preferred embodiments, the portion of the single crystal semiconductor device layer 16 removed to form a pattern of mesa islands 18 in the single crystal semiconductor device layer leaves a pattern in which each mesa island has a quadrilateral shape, e.g., square, rectangle, rhombus, parallelogram, etc., when viewed from the top. See, e.g., FIGS. 2A and 2B for depictions of an exemplary suitable mesa island shape. In some embodiments, each side of the quadrilateral shape has a dimension between about 10 micrometers and about 10,000 micrometer. The dimensions of the mesa islands may depend upon the die size required for the desired end use. For example, power device die sizes may range from about 1000 micrometers to about 10,000 micrometers. Die sizes for LED devices may range from about 10 micrometers to about 1000 micrometers, such as between about 10 micrometers and about 500 micrometers. Moreover, in some embodiments, the mesa islands may be separated by a gap having a distance between about 1 micrometer and about 100 micrometers.

In some embodiments, the portion of the single crystal semiconductor device layer 16 (FIG. 1A) removed to form a pattern of mesa islands 18 (FIGS. 1B and 1C) in the single crystal semiconductor device layer leaves a pattern in which each mesa island has a rectangular shape, when viewed from the top. See, e.g., FIGS. 2A and 2B, which are top views of SOI structure in which a portion of the donor layer is removed to form a pattern comprising a plurality of rectangular mesa islands. In some embodiments, the portion of the single crystal semiconductor device layer 16 (FIG. 1A) removed to form a pattern of mesa islands 18 (FIGS. 1B and 1C) in the single crystal semiconductor device layer leaves a pattern in which each mesa island has a square shape, when viewed from the top. In some embodiments, each side of the rectangular or square shape has a dimension between about 10 micrometers and about 10,000 micrometer. Moreover, in some embodiments, the mesa islands are separated by a gap having a distance between about 1 micrometer and about 100 micrometers.

After removing a portion of the single crystal semiconductor device layer 16 to reveal a pattern of mesa islands 18 (e.g., rectangular islands on the buried oxide layer) in the device layer as depicted in FIG. 1B (and exemplified in FIGS. 2A and 2B), in some embodiments of the invention, the SOI substrate 10 is etched to remove a portion of the dielectric layer 14 to thereby form a layer of support structures 20 underneath the mesa islands 18. See FIG. 1C for an exemplary, non-limiting depiction of support structures 20 supporting a pattern of mesa islands 18. In some embodiments, a dielectric layer 14, e.g., silicon dioxide, is partially removed so that a pattern of semi-floating or floating or both single crystal silicon mesa islands 18 is obtained. See FIG. 1C. The dielectric layer 14, e.g., the BOX, may be etched using hydrofluoric acid, either aqueous or vapor. In one embodiment, the dielectric layer 14 may be etched using an HF solution (0.5-10%) in a wet bench. In one embodiment, the dielectric layer 14 may be etched using HF vapor in a closed chamber. In some embodiments, the dielectric layer 14 is etched so that the remaining support columns 20 (FIG. 1C) essentially has the same quadrilateral shape as the mesa islands 18 in the single crystal semiconductor donor layer, but with smaller dimensions. That is, the remaining dielectric layer material 20 (FIG. 1C), which supports the mesa islands 18, may have essentially a quadrilateral shape, e.g., square, rectangle, rhombus, parallelogram, etc., when viewed from the top, and having smaller dimensions, thereby leaving floating or semi-floating mesa islands 18 formed in the SOI substrate 10.

In some embodiments, prior to deposition of the Group IIIA nitride layer, the SOI substrate 10 comprising the pattern of mesa islands 18 may be cleaned. For example, in some embodiments, the SOI substrate 10 may be baked in a hydrogen atmosphere at a temperature between about 900° C. and about 1100° C. These baking conditions may be suitable to clean residue trace oxide on the silicon device layer comprising the mesa islands.

3. Deposition of Buffer Layer on Mesa Islands

In some embodiments, prior to deposition of the Group IIIA nitride layer, a buffer layer may be optionally deposited on the pattern of mesa islands 18 formed in the single crystal semiconductor device layer of the SOI substrate 10. The buffer layer may comprise an aluminum nitride layer formed on the pattern comprising the plurality of mesa islands 18. In some embodiments, an aluminum nitride layer may be deposited by metalorganic chemical vapor phase deposition (MOCVD) or metalorganic vapor phase epitaxy (MOVPE), generally at a temperature between 800-1100° C. Molecular beam epitaxy is also an option for AlN deposition. Deposition instrumentation is available commercially from manufacturers such as Aixtron and Vecco. The aluminum nitride layer may be deposited to a thickness between about 1 nanometer and about 500 nanometers, such as between about 10 nanometers and about 100 nanometers. The buffer layer may comprise an aluminum gallium nitride layer formed on the pattern comprising the plurality of mesa islands. In general, aluminum gallium nitride may be deposited by metalorganic chemical vapor phase deposition (MOCVD) or metalorganic vapor phase epitaxy (MOVPE), generally at a temperature between 800-1100° C. The aluminum gallium nitride layer may be deposited to a thickness between about 1 nanometer and about 500 nanometers, such as between about 10 nanometers and about 100 nanometers. In some embodiments, the buffer layer may comprise an aluminum gallium nitride layer formed on an aluminum nitride layer prior to forming the Group IIIA-nitride layer on the pattern comprising the plurality of mesa islands.

4. Deposition of Group IIIA-Nitride Layer on Mesa Islands

Figure 1D:
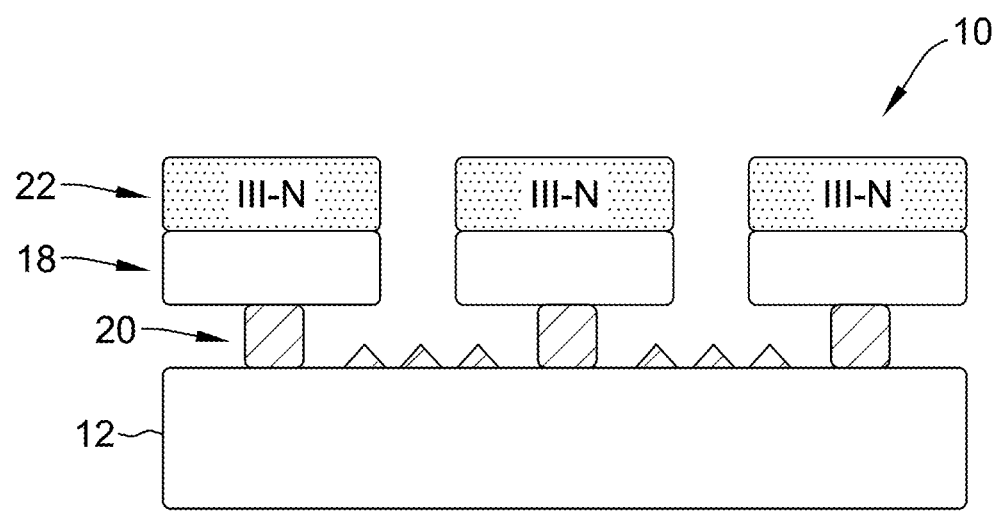

With reference now to FIG. 1D, the SOI structure 10 comprising the single crystal semiconductor handle wafer 12, the remaining portion of the dielectric layer 20 comprising the supporting structures, and the pattern of semi-floating mesa islands 18 formed from the single crystal semiconductor device layer supported by the remaining portion of the dielectric layer 20 is next subjected to deposition of a Group IIIA-nitride layer 22. In the context of the present invention, Group IIIA refers to the boron group of elements, including boron, aluminum, gallium, and indium.

Accordingly, Group IIIA-nitrides include boron nitride, aluminum nitride, gallium nitride, and indium nitride. In preferred embodiments, gallium nitride is deposited on the pattern of mesa islands. The gallium nitride may be deposited on a buffer layer, which was previously deposited upon the mesa islands. The Group IIIA-nitride layer may be deposited using metalorganic chemical vapor deposition (MOCVD), metalorganic vapor phase epitaxy (MOVPE), or molecular beam epitaxy (MBE). In some preferred embodiments, the Group IIIA nitride layer may be deposited using metalorganic chemical vapor deposition (MOCVD). A suitable MOCVD reactor may be a Veeco TurboDisc or an Aixtron G5. Aluminum precursors suitable for MOCVD include trimethylaluminum aind triethylaluminurn. Gallium precursors for MOCVD include trimethylgallium and triethylgalliumrn Indium precursors suitable for MOCVD include trimethylindium, triethylindium, di-isopropylmethylindium, and ethyldimethylindium. Nitrogen precursors suitable for MOCVD include Ammonium, phenyl hydrazine, dimethyl hydrazine, tertiary butyl amine, and ammonia. Boron precursors include diborane, boron chloride, 1,3,5-tri(N-methyl)borazine. The molar ratio of Group V precursor (e.g., ammonia) to Group IIIA precursor (e.g., trimethyl gallium) may be between 1 to 10000, preferably between 100 to 1000. A MOCVD reactor comprises a chamber comprising reactor walls, liner, a susceptor, gas injection units, and temperature control units. The parts of the reactor are made of materials resistant to and non-reactive with the precursor materials. To prevent overheating, cooling water may be flowing through the channels within the reactor walls. A substrate sits on a susceptor which is at a controlled temperature. The susceptor is made from a material resistant to the metalorganic compounds used, such as SiC or graphite. Reactive gas is introduced by an inlet that controls the ratio of precursor reactants. Before GaN growth, a seed layer of AlN may be deposited to a thickness between about 1 nanometer and about 200 nanometers, or between about 5 nanometers and about 100 nanometers, or between about 50 nanometers and about 100 nanometers, The growth temperature may be between about 600° C. and about 1200° C., such as between about 800° C. and about 1200° C., preferably between about 1000° C. and about 1150° C. The Group IIIA nitride may be formed under reduced pressure, such as between about 10 Torr to about 760 Torr (about 101 kPa), preferably between about 10 Torr (about 1.33 kPa) and about 80 Torr (about 10.67 kPa). Upon GaN growth, the diffusion of precursors from the gas phase to the cavities between two adjacent mesa islands is retarded, which further suppresses the deposition of nitride materials. The Group IIIA-nitride layer may be deposited to a thickness between about 500 nanometers and about 200 micrometers, such as between about 500 nanometers and about 100 micrometers, or between about 1 micrometer and about 50 micrometers, or between about 2 micrometers and about 10 micrometers. The strain in nitride layers is released by both misfit dislocations and the elastic deformation of the semi-floating Si layer.

The Group IIIA-nitride layer deposited according to the method of the present invention may have a threading dislocation density between about $10^6/cm^2$ and about $10^9/cm^2$, such as between about $10^7/cm^2$ and about $10^8/cm^2$. In some embodiments of the present invention, the Group IIIA-nitride layer may be deposited to a thickness such that the threading dislocation density is less than about $10^6/cm^2$, such as between about $10^3/cm^2$ and about $10^6/cm^2$, or between about $10^3/cm^2$ and about $10^5/cm^2$. The method of the present invention enables the growth of thick GaN layers without cracking. It is known that threading dislocation density (TDD) (Kapper, J C G, 300, 70 (2007) is dependent upon the thickness of the Group IIIA nitride layer. According to the method of the present invention, thick GaN layers can be grown, leading to reduced TDDs. However, GaN epi layer thickness from conventional GaN growth on blanket substrates is constrained by layer cracking due to CTE (coefficient of thermal expansion) mismatch between GaN and the substrate, which is generally below 5 um along with threading dislocation density of about $10^8/cm^2$. The method of the present invention overcomes CTE constraints by GaN growth on mesa islands. Therefore, GaN layer thickness can be extended to 10 um and above, even as thick as 100 micrometers or more, which leads to substantially reduced threading dislocation density.

Additional defect engineering can be applied to reduce the threading dislocations, such as in-situ SiNx nanopatterning. See Kapper, J C G, 300, 70 (2007) and U.S. Pat. No. 7,708,832B2. Nanopatterning involves the use of dielectrics (such as $Si_3N_4$) to block or terminate threading dislocations on the growth front surface of GaN layer. As the dielectric is thin (~1 nm), it has pinholes that provide access to the underlying GaN epi layer in the subsequent epitaxial growth. Epitaxial lateral growth above the dielectric mask promotes the formation of a continuous layer. See Kapper. The dielectric mask can be formed in the MOCVD reactor (in-situ) or by other deposition techniques, such as CVD, ALD, etc. The dielectric mask layer can be $Si_3N_4$, $SiO_2$, or other oxide.

5. Device Structures Manufactured in the Group IIIA-Nitride Layer

Figure 3A:
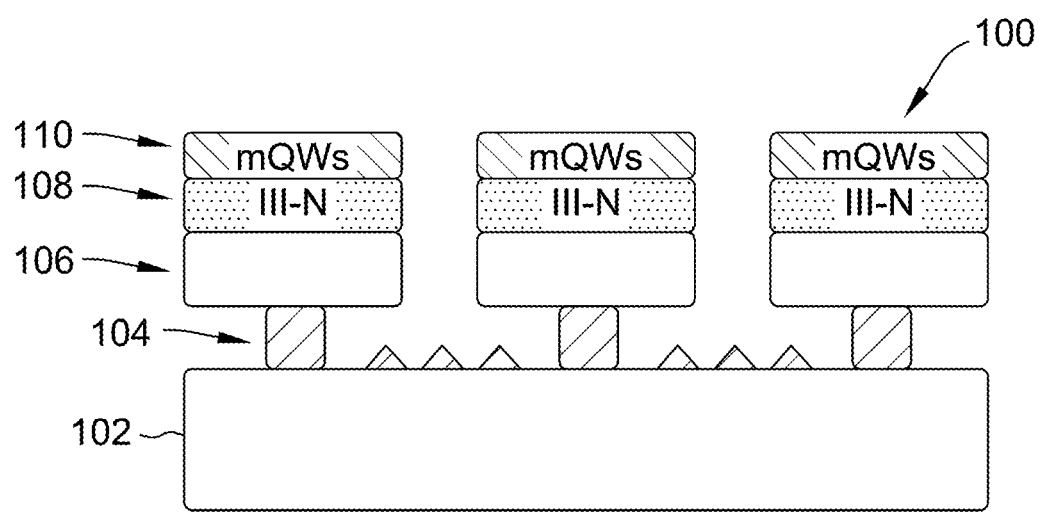
FIG. 3A depicts a multilayer structure according to an embodiment of the present invention. In one embodiment, the multilayer structure depicted in FIG. 3A comprises a light emitting diode (LED) device formed directly on a Group IIIA-nitride on mesa islands.

In some embodiments and with reference to FIG. 3A, upon completion of deposition of the Group IIIA-nitride layer 108 on the pattern of mesa islands 106 formed in the single crystal semiconductor device layer (16 in FIG. 1A), multiple quantum wells and a P—GaN contact layer 110 can be directly grown to complete a LED device structure. The growth of quantum wells is discussed in the literature. See, e.g., Zhang, phys. stat. sol. (a) 188, No. 1, 151-154 (2001)]. After formation of quantum wells in the Group IIIA-nitride layer, the structure 100 comprises the single crystal semiconductor handle wafer 102, a layer of supporting structures 104 derived from the dielectric layer (e.g., buried oxide layer, and 14 in FIG. 1A), a layer comprising the pattern of mesa islands 106 (derived from the device layer 16 in FIG. 1A), the layer of Group IIIA-nitride 108 formed on layer comprising the pattern of mesa islands 106, and the multiple quantum wells and P—GaN contact layer 110 formed in the layer of Group IIIA-nitride 108. In some embodiments, the mesa islands 106 comprising the Group IIIA-nitride 108 and the quantum wells 110 are transferred to another substrate, such as glass to complete LED device fabrication and packaging.

Figure 3B:
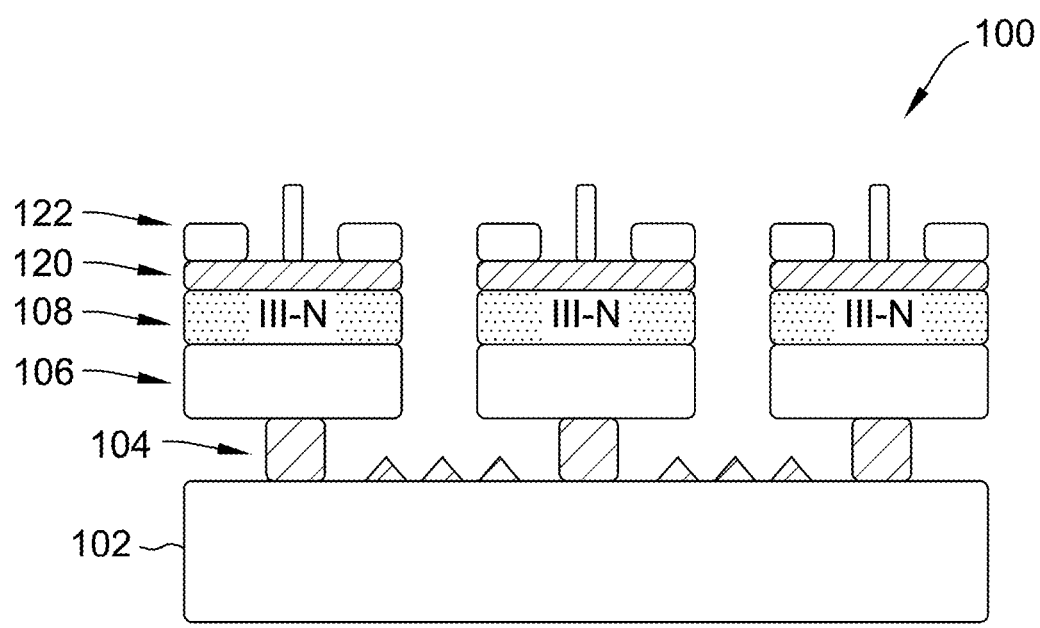
FIG. 3B depicts a multilayer structure according to an embodiment of the present invention. In one embodiment, the multilayer structure depicted in FIG. 3B comprises a high-electron-mobility transistor (HEMT) power device formed directly on a Group IIIA-nitride on mesa islands.
Figure 4:
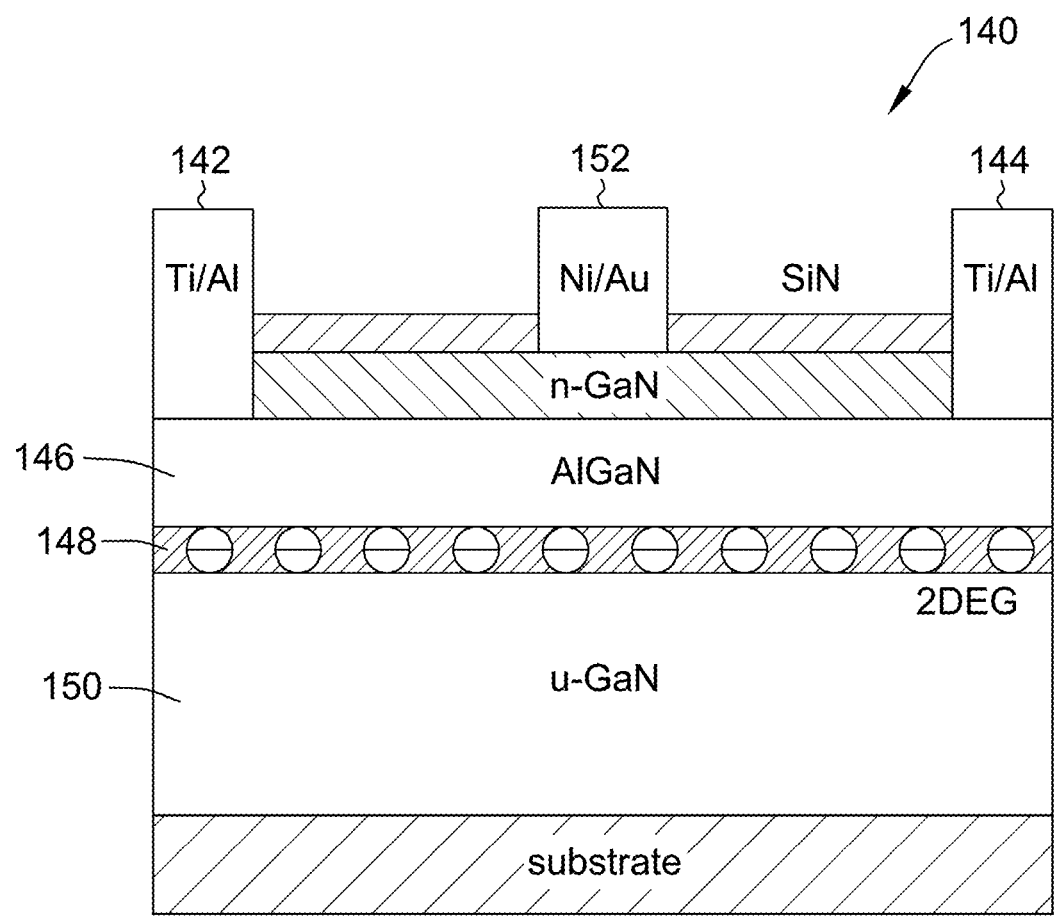
FIG. 4 is a depiction of a lateral high-electron-mobility transistor (HEMT) power device that may be built on a Group IIIA-nitride layer on mesa islands.

In some embodiments and with reference to FIG. 3B, upon completion of deposition of the Group IIIA-nitride layer 108 on the pattern of mesa islands 106 formed in the single crystal semiconductor donor layer, a lateral high-electron-mobility transistor (HEMT) device 120, 122 may be directly grown on the Group IIIA-nitride layer 108. The HEMT device may be used as a power device or as a radiofrequency device. The die could then be detached and mounted directly into a package. The thin structure (thin silicon with heteroepi layers) would help minimize thermal conductivity losses. A lateral high-electron-mobility transistor (HEMT) device 140 that may be manufactured on a Group IIIA-nitride, e.g., GaN is illustrated in FIG. 4. See also, e.g., Joshin, Proceedings of Asia-Pacific Microwave Conference, 2006. In the lateral HEMT device 140 depicted in FIG. 4, electrons flow horizontally from source 142 to drain 144 along the 2-dimensional electron gas 148 (2DEG) formed at the interface between AlGaN layer 146 and the GaN layer 150. Gate 152 voltage modulates the 2DEG 148 to open or close the current path. A high electric field is built up between drain 144 and gate 152 and breakdown voltage is usually limited by this electric field. The electron density of the 2DEG 148 determines the on-resistance ($R_{on}$) and the drive current. As the 2DEG 148 electron density ($5\text{-}10 \times 10^{12}$/ $cm^2$) is induced by polarization effect, the residual stress from CTE mismatch can change the device performance as well as device reliability. See Jocob Leach and Hadis Morkoc, Proceedings of the IEEE, 1127, V98, No. 7, July 2010. The present invention enables reduction in the residual stress from CTE mismatch and provides more stable device performance.

Another advantage of the present invention is that it provides the option to transfer the high-quality Group IIIA nitride layer (e.g., a GaN layer deposited by epitaxial deposition) to another carrier substrate that is engineered to cater for the device application. For example, an insulating or semi-insulating or high resistivity carrier substrate, such as sapphire or polycrystalline AlN, is used for an HEMT radio frequency (RF) devices built in GaN layers to minimize the RF loss and signal distortion. HEMT RF devices comprise similar structures to HEMT power devices, but they operate at lower voltages. The RF HEMT structure is a lateral one like the high voltage (600V) power device. Because voltage requirement is much lower (<100V) the GaN layer may not be as thick as for a power device, but otherwise the layer structure and sequence is typically the same. These devices are built on semi-insulating substrates to avoid substrate coupling in high frequency signal, in the Nitronex GaN/Si(111) case high resistivity silicon (>1000 ohm-cm). A highly conductive carrier substrate, such as diamond or diamond coated Si, can be used for power HEMT devices to facilitate heating dissipation.

In some embodiments, the structure as depicted in FIG. 1D is suitable for use as a starting point in the manufacture of high voltage power devices. In the manufacture of high voltage power devices, the mesa islands comprising the Group IIIA-nitride material (e.g., GaN) may be transferred to a carrier substrate for additional growth of the Group IIIA-nitride material and subsequent device fabrication. In some embodiments, the carrier substrate has properties of high thermal conductivity and low electrical conductivity. In some embodiments, the carrier substrate may comprise a high resistivity single crystal semiconductor substrate, such as a high resistivity single crystal silicon substrate, a polycrystalline silicon substrate, an aluminum nitride substrate, a sapphire substrate, a polycrystalline aluminum nitride substrate, a diamond substrate, a diamond coated silicon wafer, and the like. With reference now to FIGS. 5A through 5D, a multilayer structure 200 is provided comprising a single crystal semiconductor handle wafer 202, a layer of supporting structures 204 derived from the dielectric layer (e.g., buried oxide layer, and 14 in FIG. 1A), a layer comprising the pattern of mesa islands 206 (derived from the device layer 16 in FIG. 1A), and the layer of Group IIIA-nitride 208 formed on layer comprising the pattern of mesa islands 206.

In some embodiments, a thin interfacial bonding layer 210 is deposited on the layer of Group IIIA-nitride 208. In some embodiments, the thin interfacial bonding layer 210 comprises between about 1 nanometer and about 5 nanometers of aluminum oxide ($Al_2O_3$). The interfacial bonding layer 210 may be deposited by atomic layer deposition or molecular beam epitaxy.

After deposition of the interfacial bonding layer 210, the layer may be activated for bonding by oxygen or nitrogen plasma activation. In some embodiments, the oxygen plasma surface activation tool is a commercially available tool, such as those available from EV Group, such as EVG®810LT Low Temp Plasma Activation System. The optionally cleaned single crystal semiconductor donor wafer is loaded into the chamber. The chamber is evacuated and backfilled with $O_2$ to a pressure less than atmospheric to thereby create the plasma. The SOI multilayer structure 200 is exposed to this plasma for the desired time, which may range from about 1 second to about 120 seconds. Oxygen plasma surface oxidation is performed in order to render the front surface of the interfacial bonding layer 210 hydrophilic and amenable to bonding to a single crystal semiconductor handle substrate prepared according to the method described above.

Figure 5A:
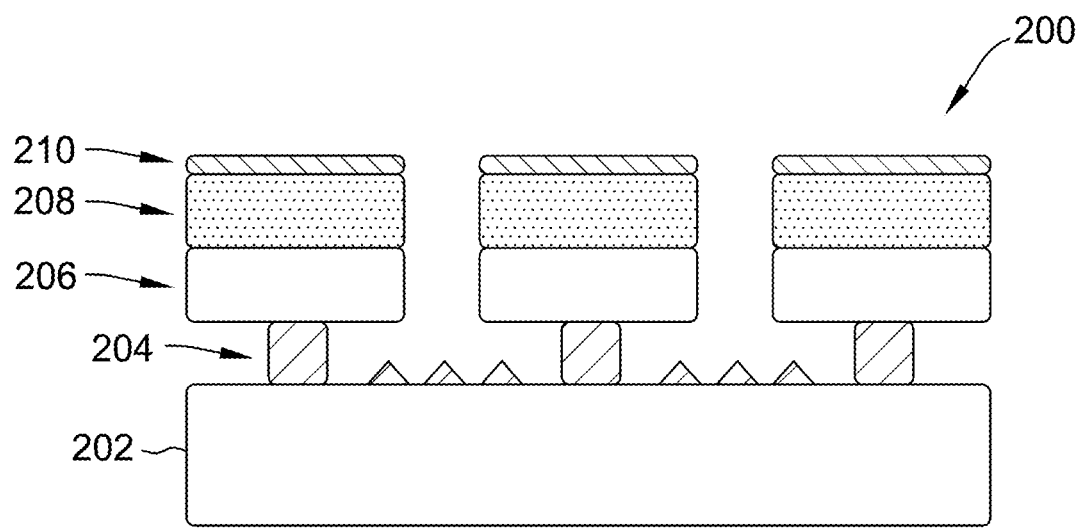
FIGS. 5A through 5D depict an embodiment of the process of the present invention.
Figure 5B:
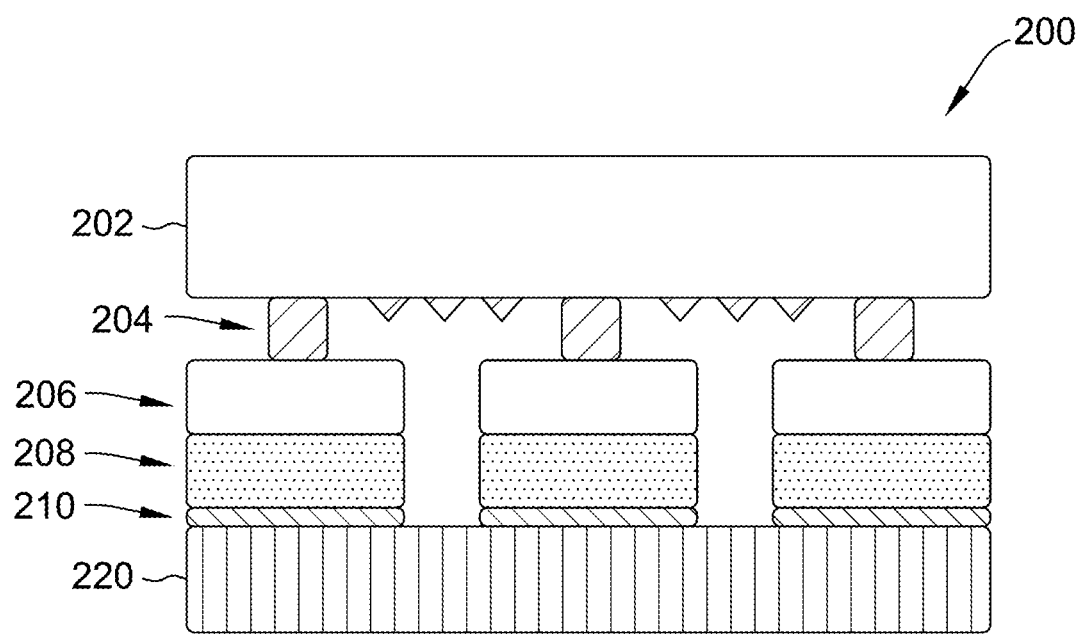

With reference now to FIG. 5B, the multilayer structure 200 comprising a single crystal semiconductor handle wafer 202, a layer of supporting structures 204 derived from the dielectric layer (e.g., buried oxide layer, 14 in FIG. 1A), a layer comprising the pattern of mesa islands 206 (derived from the device layer 16 in FIG. 1A), and the layer of Group IIIA-nitride 208 formed on layer comprising the pattern of mesa islands 206, and the activated interfacial bonding layer 210 is next bonded to a handle or carrier substrate 220. The handle or carrier substrate 220 can be any substrate that is suitable for a specific application. For power HEMT devices, good thermal conductivity substrates, such as diamond are suitable. For vertical power devices, metal substrates, such as copper, are suitable substrates. For LED devices, a transparent substrate, such as sapphire and glass, are suitable. For RF HEMT devices, semi-insulating or insulating substrates are preferred, such as sapphire, high-resistivity Si, AlN, etc. The bond between the multilayer structure 200 and the carrier substrate 220 is not required to be strong. In some embodiments, the handle substrate 220 only provides support to the GaN mesa island. In some embodiments, there is no subsequent debonding process involved, such as cleaving. In some embodiments, the interface layer is optional provided that the plasma activation aided bonding process is used.

According to the process of the present invention, the dielectric layer 204 is etched away to remove the dielectric layer and the single crystal silicon handle substrate 202. In some embodiments, the dielectric layer is etched by immersing the bonded structure in an etchant solution comprising 1-10% HF. Once the remaining dielectric layer is completed etched, the pattern of mesa islands 206 and the layer of Group IIIA-nitride 208 are released from the single crystal silicon handle substrate 202 substrate and are transferred to the carrier substrate 220. At the interface of the Group IIIA-nitride layer 208 and the carrier substrate 220, the interfacial bonding layer 210 is partially etched and weakens the bonding strength, which accommodates any potential thermal stress in the subsequent Group IIIA-nitride thickening process.

Figure 5C:
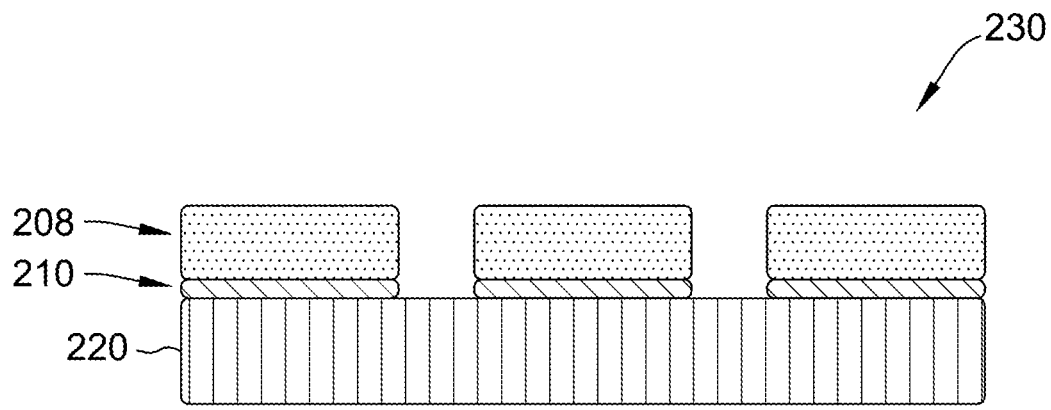

According to the process of the present invention, the mesa islands formed in the single crystal semiconductor donor layer 206 are next removed to thereby prepare the structure 230 shown in FIG. 5C comprising carrier substrate 220, the interfacial bonding layer 210, and the Group IIIA-nitride layer 208. This layer transfer process on a different substrate provides versatile options for different device application. On the as-transferred GaN mesa islands, LEDs, a HEMT power device, and a HEMT radiofrequency device can be built. The mesa islands formed in the single crystal semiconductor donor layer 206 may be etched away by either wet chemistry such as $HNO_3/HF$ solution and TMAH or by plasma etch. In some embodiments wherein buffer layers comprising AlN and/or AlGaN are present, a plasma etch is preferred. Plasma etch is also suitable for removing defective Group IIIA-nitride layers. After removing the top defective layers, a high-quality Group IIIA-nitride layer 208 (e.g., GaN) with threading dislocations between about $10^6/cm^2$ and about $10^9/cm^2$, such as between about $10^7/cm^2$ and about $10^8/cm^2$, is left on the carrier substrate 220.

Figure 5D:
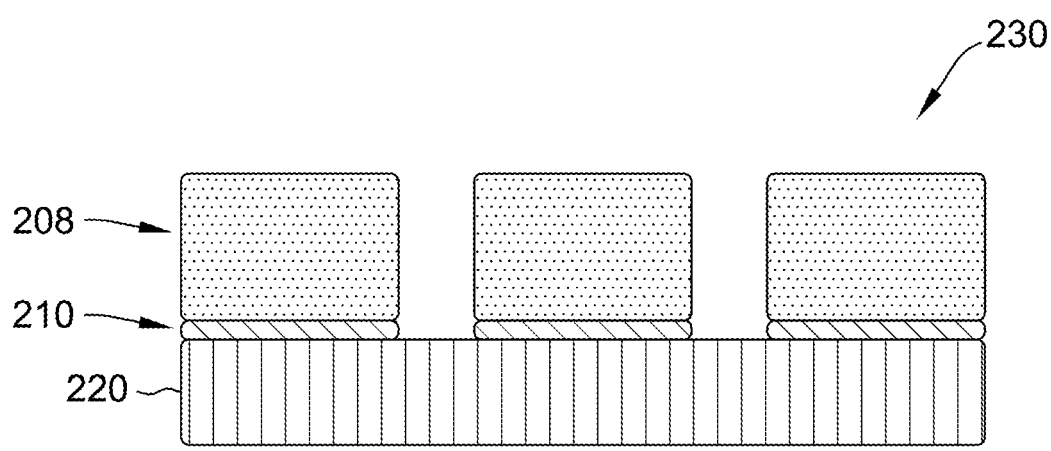

In some embodiments and with Reference to FIG. 5D, the high-quality Group IIIA-nitride layer 208 (e.g., GaN) may be thickened. In some embodiments, the high-quality Group IIIA-nitride layer 208 (e.g., GaN) may be thickened by epitaxial deposition, e.g., metalorganic vapor phase epitaxy (MOVPE) or hydride vapor phase epitaxy (HVPE). Commercially available HVPE reactors include the Aura HVPE system from Agnitron Technology, Inc. The Ga precursors can be synthesized GaN powder or Ga liquid. HCl vapor gas is used to convert GaN or Ga liquid into GaCl precursor. $NH_3$ is used as the nitrogen precursor. Ar is used as the carrier gas. GaN growth occur at a temperature between about 1000° C. and about 1200° C., typically from about 1000° C. to about 1100° C. The growth rate can be as high as 100 micrometers per hour. In some embodiments, the Group IIIA-nitride layer can be thickened to a thickness between about 2 micrometers and about 50 micrometers, preferably between about 5 micrometers and about 10 micrometers. In some embodiments, the Group IIIA-nitride layer can be thickened to a thickness between about 2 micrometers and about 2000 micrometers, such as between about 2 micrometers and about 1000 micrometers, or between about 100 micrometers and about 300 micrometers.

In some embodiments, the thickened Group IIIA nitride layer, e.g., GaN layer, may be doped during the growth process. In some embodiments, the Group IIIA-nitride layer may be doped with an N type dopant, such as silicon Si, germanium Ge, sulfur S, selenium Se, and tin Sn. Suitable precursors that may be incorporated into the gas recipe during layer growth in order to dope the layer with an N type dopant may include $SiH_4$, $GeH_4$, $H_2S$, $H_2Se$, and $(C_2H_5)Sn$. In some embodiments, the Group IIIA-nitride layer may be doped with a P type dopant, such as Mg or Zn. Suitable precursors that may be incorporated into the gas recipe during layer growth in order to dope the layer with an N type dopant may include Magnesium bis(cyclopentadienyl), diethyl zinc, and dimethyl zinc. In some embodiments, the thickened Group IIIA nitride layer, e.g., GaN layer, can be doped with silicon. In some embodiments, $SiH_4$ gas may be added to the gas recipe during the Group IIIA-nitride layer thickening process in order to dope the layer with Si. In some embodiments, $SiH_4$ gas may be added during GaN layer thickening in order to dope the GaN layer with Si. The inclusion of $SiH_4$ during Group IIIA-nitride layer thickening may result in doping the layer with Si to thereby prepare n type Group IIIA-nitride layer. The inclusion of $SiH_4$ during GaN layer thickening may result in doping the layer with Si to thereby prepare N type GaN layer. The dopant concentration may range from about $1\times10^{15}$ dopant atoms/cm³ to about $5\times10^{20}$ dopant atoms/cm³. In some embodiments to prepare N− Group IIIA-nitride layers, the concentration of Si dopant may range from about $1\times10^{15}$ dopant atoms/cm³ to about $3\times10^{17}$ dopant atoms/cm³, such as from about $1\times10^{16}$ dopant atoms/cm³ to about $3\times10^{16}$ dopant atoms/cm³. In some embodiments to prepare N+ Group IIIA-nitride layers, the concentration of Si dopant may range from about $1\times10^{18}$ dopant atoms/cm³ to about $5\times10^{20}$ dopant atoms/cm³, such as from about $1\times10^{19}$ dopant atoms/cm³ to about $3\times10^{20}$ dopant atoms/cm³. In some embodiments, e.g., embodiments wherein the Group IIIA-nitride layer's intended use is for a vertical gallium nitride-on-gallium nitride high voltage power devices, the dopant level may be varied during the growth of the thickened Group IIIA-nitride layer. Varying the dopant level enables the growth of Group IIIA-nitride layer having multiple layers of different dopant concentration. In some embodiments, the Group IIIA-nitride layer may first be doped with N− dopant, such as Si, to a dopant level from about $1\times10^{15}$ dopant atoms/cm³ to about $3\times10^{17}$ dopant atoms/cm³, such as from about $1\times10^{16}$ dopant atoms/cm³ to about $3\times10^{16}$ dopant atoms/cm³, which is followed by the formation of an N+ layer by increasing the dopant level to between about $1\times10^{18}$ dopant atoms/cm³ to about $5\times10^{20}$ dopant atoms/cm³, such as from about $1\times10^{19}$ dopant atoms/cm³ to about $3\times10^{20}$ dopant atoms/cm³.

Multilayer structures 230 comprising the carrier substrate 220, the interfacial bonding layer 210, and the thickened Group IIIA-nitride layer 208, as depicted in FIG. 5D, are suitable for the fabrication of HEMT power devices with target application of 800-1000V. The structures are also suitable for HEMT RF devices, LEDs, laser diodes, and vertical gallium nitride-on-gallium nitride high voltage power devices, among other uses.

In some embodiments, multilayer structures 230 comprising carrier substrate 220, the interfacial bonding layer 210, and the thickened Group IIIA-nitride layer 208, as depicted in FIG. 5D, can also be subject to additional growth by epitaxy, e.g., hydride vapor phase epitaxy (HVPE), to reach a target thickness of at least about 50 micrometers, such as between about 50 micrometers and about 2000 micrometers, or between about 50 micrometers and about 1000 micrometers, such as between about 100 micrometers and about 500 micrometers. Thickened Group IIIA-nitride layers may be achieved with reduced threading dislocation density. In some embodiments, the Group IIIA-nitride layers having a thickness between about 50 micrometers and about 2000 micrometers, such as between about 100 micrometers and about 1000 micrometers may have threading dislocation less than about $10^6/cm^2$, such as between about $10^3/cm^2$ and about $10^6/cm^2$, or between about $10^3/cm^2$ and about $10^5/cm^2$, which is compared to bulk GaN materials. Such structures 230 are suitable for use in the manufacture of vertical power devices (e.g., HEMT power devices) and laser diodes as well as high brightness LEDs. See, e.g., Uesugi, CS MANTECH Conference, Florida, 2009. A vertical power device is suitable for handling high power, such as 20 kW and above. The structures 230 depicted in FIG. 5D are also suitable for vertical gallium nitride-on-gallium nitride high voltage power devices. See, e.g., Kizilyalli et al., Vertical Devices in Bulk GaN Drive Diode Performance to Near-Theoretical Limits, HOW2POWER TODAY, March 2013. The advantage of vertical power device over lateral HEMT device is: smaller size, higher breakdown voltage and lower parasitic inductance. However, since the current flow thru the whole GaN layer, the requirements for GaN quality, like threading dislocations and impurities are more stringent. So far, vertical power device is made on small size bulk GaN substrates that are expensive. In this disclosure, with the GaN growth on floating and semi-floating mesa islands, a viable approach is provided to grow thick GaN materials that have comparable physical and electrical properties of bulk GaN substrates at a lower cost. The disclosed method uses conventional growth method, MOCVD or MOVPE and is manufacturing scalable on large substrates.

The present invention therefor provides high quality thick Group IIIA-nitride layers, suitably GaN layers, without cracks. The Group IIIA-nitride layers can be deposited to thicknesses of at least 500 nanometers, and can be grown up to 1000 micrometers thick. The method of the present invention minimizes residual stress in GaN layer, thereby reducing the impact of stress on device performance. The technique is suitably scaled to large wafer size up to 200 mm and beyond. The method of the present invention provides layer transfer options. Eliminates the potential harm on RF and power device from the conductive layer between the AlN seed layer and the Si substrate due to the autodoping of Al in Si. The method of the present invention enables the integration of optoelectronic device with CMOS devices on Si substrates. The method of the present invention improves GaN quality to boost the performance of LED, RF, Power devices.

Having described the invention in detail, it will be apparent that modifications and variations are possible without departing from the scope of the invention defined in the appended claims.

As various changes could be made in the above compositions and processes without departing from the scope of the invention, it is intended that all matter contained in the above description be interpreted as illustrative and not in a limiting sense.

When introducing elements of the present invention or the preferred embodiment(s) thereof, the articles "a," "an," "the," and "said" are intended to mean that there are one or more of the elements. The terms "comprising," "including," and "having" are intended to be inclusive and mean that there may be additional elements other than the listed elements.

What is claimed is:

1. A multilayer structure comprising:
   a thermally conductive carrier substrate selected from the group consisting of diamond and diamond coated silicon;
   an interfacial bonding layer comprising aluminum oxide having a thickness between about 1 nanometer and 5 nanometers; and
   a Group IIIA-nitride layer, the Group IIIA-nitride layer having a thickness between about 500 nanometers and about 2000 micrometers and comprising threading dislocations at a threading dislocation density between about $10^3/cm^2$ and $10^5/cm^2$, and further comprising components of a lateral HEMT power device, a laser diode, or a vertical gallium nitride-on-gallium nitride high voltage power device.

2. The multilayer structure of claim 1 wherein the Group IIIA-nitride layer comprises a N type dopant selected from the group consisting of Si, Ge, S, Se, and Sn in a concentration between about $1\times10^{15}$ dopant atoms/cm$^3$ to about $5\times10^{20}$ dopant atoms/cm$^3$.

3. The multilayer structure of claim 1 wherein the Group IIIA-nitride layer comprises a P type dopant selected from the group consisting of Mg and Zn in a concentration between about $1\times10^{15}$ dopant atoms/cm$^3$ to about $5\times10^{20}$ dopant atoms/cm$^3$.

4. The multilayer structure of claim 1 wherein the Group IIIA-nitride layer has a thickness between about 100 micrometers and about 1000 micrometers.

5. The multilayer structure of claim 1 wherein the Group IIIA-nitride layer has a thickness between about 100 micrometers and about 300 micrometers.

6. The multilayer structure of claim 1 wherein the Group IIIA-nitride layer has a thickness between about 2 micrometers and about 10 micrometers.

7. The multilayer structure of claim 1 wherein the Group IIIA-nitride layer has a thickness between about 500 nanometers and about 100 micrometers.

8. A multilayer structure comprising:
   a semi-insulating or high resistivity carrier substrate selected from the group consisting of a sapphire substrate and a polycrystalline aluminum nitride substrate;
   an interfacial bonding layer comprising aluminum oxide having a thickness between about 1 nanometer and 5 nanometers; and
   a Group IIIA-nitride layer, the Group IIIA-nitride layer having a thickness between about 500 nanometers and about 2000 micrometers and comprising threading dislocations at a threading dislocation density between about $10^3/cm^2$ and $10^5/cm^2$, and further comprising quantum wells formed in the Group IIIA-nitride layer and a P—GaN contact layer, components of a lateral HEMT radiofrequency device, or components of a light emitting diode.

9. The multilayer structure of claim 8 wherein the Group IIIA-nitride layer comprises a N type dopant selected from the group consisting of Si, Ge, S, Se, and Sn in a concentration between about $1\times10^{15}$ dopant atoms/cm$^3$ to about $5\times10^{20}$ dopant atoms/cm$^3$.

10. The multilayer structure of claim 8 wherein the Group IIIA-nitride layer comprises a P type dopant selected from the group consisting of Mg and Zn in a concentration between about $1\times10^{15}$ dopant atoms/cm$^3$ to about $5\times10^{20}$ dopant atoms/cm$^3$.

11. The multilayer structure of claim 8 wherein the Group IIIA-nitride layer has a thickness between about 100 micrometers and about 1000 micrometers.

12. The multilayer structure of claim 8 wherein the Group IIIA-nitride layer has a thickness between about 100 micrometers and about 300 micrometers.

13. The multilayer structure of claim 8 wherein the Group IIIA-nitride layer has a thickness between about 500 nanometers and about 100 micrometers.

14. The multilayer structure of claim 8 wherein the Group IIIA-nitride layer has a thickness between about 2 micrometers and about 10 micrometers.

* * * * *